(12) United States Patent
Mao et al.

(10) Patent No.: US 11,211,485 B2
(45) Date of Patent: Dec. 28, 2021

(54) TRENCH POWER TRANSISTOR

(71) Applicant: SUZHOU ORIENTAL SEMICONDUCTOR CO., LTD., Jiangsu (CN)

(72) Inventors: Zhendong Mao, Jiangsu (CN); Yuanlin Yuan, Jiangsu (CN); Lei Liu, Jiangsu (CN); Wei Liu, Jiangsu (CN); Rui Wang, Jiangsu (CN); Yi Gong, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 160 days.

(21) Appl. No.: 16/475,728

(22) PCT Filed: Oct. 29, 2018

(86) PCT No.: PCT/CN2018/112339
§ 371 (c)(1),
(2) Date: Jul. 3, 2019

(87) PCT Pub. No.: WO2019/085851
PCT Pub. Date: May 9, 2019

(65) Prior Publication Data
US 2021/0098619 A1 Apr. 1, 2021

(30) Foreign Application Priority Data

Nov. 1, 2017 (CN) .......................... 201711058078.9
Nov. 1, 2017 (CN) .......................... 201711058085.9
Nov. 1, 2017 (CN) .......................... 201711058205.5

(51) Int. Cl.
*H01L 29/78* (2006.01)
*H01L 29/40* (2006.01)
*H01L 29/06* (2006.01)
*H01L 29/10* (2006.01)

(52) U.S. Cl.
CPC ...... *H01L 29/7813* (2013.01); *H01L 29/0634* (2013.01); *H01L 29/1037* (2013.01); *H01L 29/1095* (2013.01); *H01L 29/407* (2013.01)

(58) Field of Classification Search
CPC ............. H01L 29/7813; H01L 29/0634; H01L 29/1037; H01L 29/1095; H01L 29/407;
(Continued)

(56) References Cited

U.S. PATENT DOCUMENTS

| 6,621,107 B2 | 9/2003 | Blanchard et al. |
| 2003/0080355 A1* | 5/2003 | Shirai ................. H01L 27/0629 257/200 |
| 2006/0017078 A1* | 1/2006 | Thapar ................ H01L 29/7828 257/284 |

FOREIGN PATENT DOCUMENTS

| CN | 102074501 A | 5/2011 |
| CN | 102610643 A | 7/2012 |

(Continued)

OTHER PUBLICATIONS

International Search Report on International Application No. PCT/CN2018/112339, dated Jan. 30, 2019 (4 pages).
(Continued)

*Primary Examiner* — Cuong B Nguyen
(74) *Attorney, Agent, or Firm* — Buchanan Ingersoll & Rooney PC (57) ABSTRACT

Provided is a trench-type power transistor. The trench-type power transistor includes a source, a drain, a first gate, a second gate, a body diode and a body region contact diode. The body diode and the body region contact diode are connected in series. The first gate controls turn-on and turn-off of a first current channel through a gate voltage, the (Continued)

second gate is connected to the source and controls turn-on and turn-off of a second current channel through a source voltage.

10 Claims, 5 Drawing Sheets

(58) Field of Classification Search
CPC . H01L 29/404; H01L 29/7806; H01L 27/088; H01L 29/0696; H01L 29/7375; H01L 29/7393–7395; H01L 29/7397; H01L 29/66325; H01L 29/66333–66348; H01L 29/4236; H01L 29/42352; H01L 29/66613–66628; H01L 29/42356
See application file for complete search history.

(56) References Cited

FOREIGN PATENT DOCUMENTS

| | | |
|---|---|---|
| CN | 103137698 A | 6/2013 |
| CN | 103441148 A | 12/2013 |

OTHER PUBLICATIONS

German Office Action dated Aug. 28, 2019, of the corresponding German Patent App. No. DE 11 2018 000 209.8, and a partial English translation thereof (10 pages).

* cited by examiner

TRENCH POWER TRANSISTOR

CROSS-REFERENCE TO RELATED APPLICATIONS

This is a National Stage Application, filed under 35 U.S.C. 371, of International Patent Application No. PCT/CN2018/112339, filed on Oct. 29, 2018, which claims priority to Chinese patent application No. 201711058078.9 filed on Nov. 1, 2017, Chinese patent application No. 201711058085.9 filed on Nov. 1, 2017, and Chinese patent application No. 201711058205.5 filed on Nov. 1, 2017, the disclosures of which are incorporated herein by reference in their entireties.

TECHNICAL FIELD

The present disclosure relates to the technical field of semiconductor power devices and, for example, to a trench-type power transistor.

BACKGROUND

Figure 1:
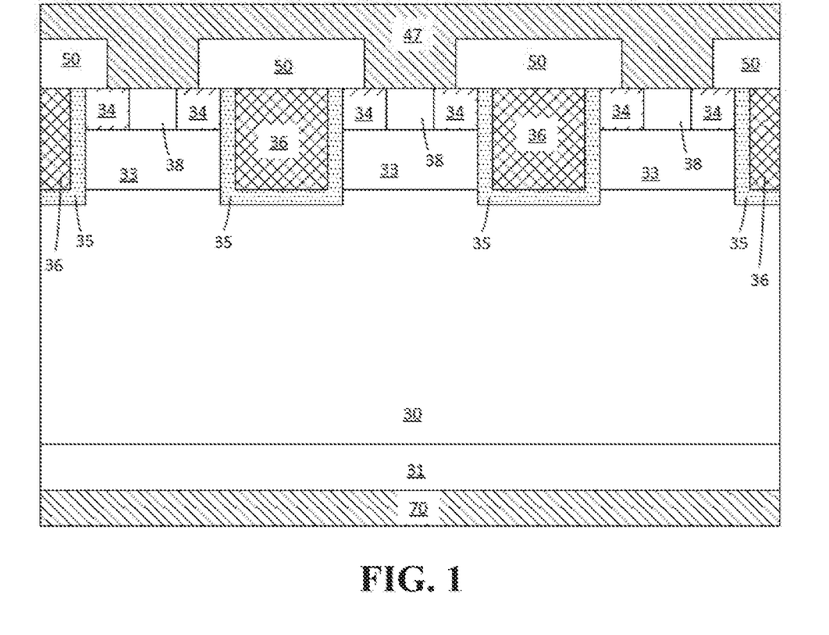
FIG. 1 is a cross-section view of a structure of a trench-type power transistor in the related art.

A trench-type power transistor in the related art has a sectional structure as shown in FIG. 1 and includes: a n-type drain region 31 and a n-type drift region 30 located on the n-type drain region 31; multiple p-type body regions 33 formed in the n-type drift region 30; and a gate trench located between two adjacent p-type body regions 33 and recessed in the n-type drift region 30. The n-type drain region 31 is connected to a drain voltage through a drain metal contact layer 70. A parasitic body diode structure is formed between each p-type body region 33 and the n-type shift region 30 in the trench-type power transistor. A p-type body region contact region 38 is formed in each p-type body region 33. A doping concentration of the p-type body region contact region 38 is greater than a maximum value of a doping concentration of the p-type body region 33, so that the p-type body region contact region 38 and a source metal contact layer 47 form an ohmic contact structure. In the p-type body region 33, each side of the p-type body region contact region 38 forms a n-type source region 34. A gate dielectric layer 35 and a gate 36 are formed in the gate trench. The gate 36 controls turn-on and turn-off of a current trench through a gate voltage. An insulating medium layer 50 is an interlayer insulating layer used for isolating metal layers.

Figure 2:
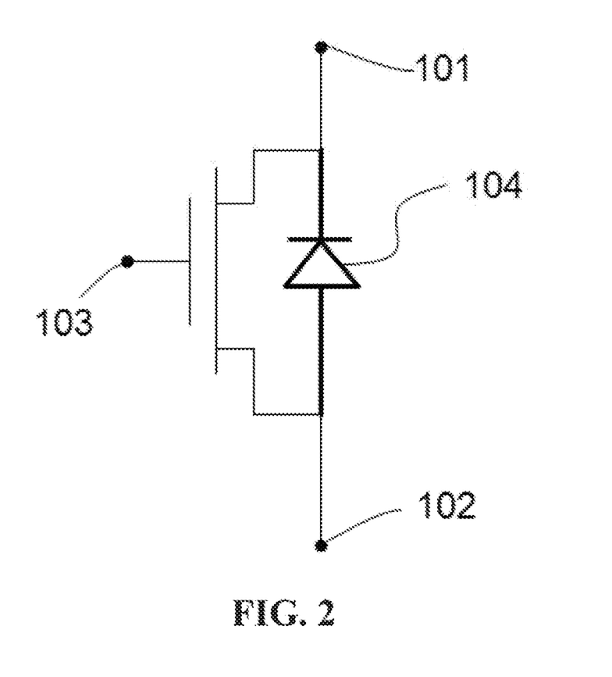
FIG. 2 is schematic diagram of an equivalent circuit of the trench-type power transistor shown in FIG. 1.

FIG. 2 is a schematic diagram of an equivalent circuit of the trench-type power transistor shown in FIG. 1. The equivalent circuit includes a drain 101, a source 102, a gate 103, and a body diode 104. The body diode 104 has an intrinsic parasitic structure in the power transistor. The working principle of the trench-type power transistor is illustrated hereafter. (1) When a gate-source voltage Vgs is less than a threshold voltage Vth of the trench-type power transistor, and a drain-source voltage Vds is greater than 0V, the trench-type power transistor is in a turn-off state. (2) When the gate-source voltage Vgs is greater than the threshold voltage Vth of the trench-type power transistor, and the drain-source voltage Vds is greater than 0V, the trench-type power transistor is turned on forward and a current flows from the drain to the source through the current channel controlled by the gate. In a case where the trench-type power transistor in the related art is turned off, when the drain-source voltage Vds is less than 0V, the parasitic body diode in the trench-type power transistor is in a forward-bias state, an inverse current flows from the source to the drain through the body diode. In this case, the current in the body diode injects minority carriers, and these minority carriers causes reverse recovery when the body diode turns to a reverse-bias state, leading to a large reverse recovery current and long reverse recovery time. The reverse recovery current generated by the minority carriers results in increase of the loss of the trench-type power transistor and decrease of the system efficiency. At the same time, the reverse recovery current can easily cause direct connection between upstream and downstream transistors, burning out the device and influencing the safety of the power transistor.

SUMMARY

The present disclosure provides a trench-type power transistor having a rapid reverse recovery function for reducing reverse recovery time caused by injection of minority carriers of the trench-type power transistor in the related art.

A trench-type power transistor includes: a n-type drain region and a n-type drift region located on the n-type drain region, where the n-type drift region is provided with at least two p-type body regions, each p-type body region is provided with a p-type body region contact region, a first n-type source region and a second n-type source region; a conductive layer located on the p-type body region contact region, where the conductive layer and the p-type body region contact region form a body region contact diode structure, where the conductive layer is a cathode of the body region contact diode structure and the p-type body region contact region is an anode of the body region contact diode structure; a gate trench located between two adjacent p-type body regions and recessed in the n-type drift region, where the gate trench is provided with a gate dielectric layer, a first gate and a second gate; a first current channel located in the p-type body region and between the first n-type source region and the n-type drift region, where the first gate controls turn-on and turn-off of the first current channel through a gate voltage; and a second current channel located in the p-type body region and between the second n-type source region and the n-type drill region, where the second gate, the first n-type source region, the second n-type source region and the conductive layer are electrically connected and are all connected to a source voltage, the second gate controls turn-on and turn-off of the second current channel through the source voltage.

In one embodiment, a turn-on voltage of the first current channel is greater than a turn-on voltage of the second current channel.

In one embodiment, the conductive layer is a source metal contact layer located on each of the p-type body regions, a doping concentration of the p-type body contact region is less than a maximum value of a doping concentration of the p-type body region, and the p-type body region contact region and the source metal contact layer form a Schottky barrier diode structure.

In one embodiment, the second gate, the first n-type source region and the second n-type source region are connected through the source metal contact layer, the source metal contact layer is externally connected to the source voltage.

In one embodiment, the conductive layer is a n-type polysilicon layer located on the p-type body region, the n-type polysilicon layer and the p-type body region contact region form a silicon-based body region contact diode structure. A n-type polysilicon layer is a cathode and the p-type body region contact region is an anode.

In one embodiment, the n-type polysilicon layer, the second gate, the first n-type source region and the second n-type source region are connected, the n-type polysilicon layer is externally connected to the source voltage through the source metal contact layer.

In one embodiment, the n-type polysilicon layer, the first n-type source region and the second n-type source region are connected. A second gate is connected to the n-type polysilicon layer through the source metal contact layer, the source metal contact layer is externally connected to the source voltage.

In one embodiment, the conductive layer is a n-type doped region located in the p-type body region, the n-type doped region is located between the first n-type source region and the second n-type source region, the n-type doped region and the p-type body region contact region form a silicon-based body region contact diode structure. The n-type doped region is a cathode and the p-type body region contact region is an anode.

In one embodiment, the second gate is connected to the first n-type source region, the second n-type source region and the n-type doped region through the source metal contact layer, the source metal contact layer is externally connected to the source voltage.

In one embodiment, the first gate and the second gate are disposed on opposite sides inside the gate trench, the first gate and the second gate are isolated by an insulating medium layer in the gate trench.

In one embodiment, the gate trench includes a first gate trench and a second gate trench, the first gate trench is provided with a gate dielectric layer and a first gate, the second gate trench is provided with a gate dielectric layer and a second gate, the first gate trench and the second gate trench are isolated by the n-type shift region.

In one embodiment, the trench-type power transistor further includes a shielded gate trench recessed in the n-type shift region, where an opening of the shielded gate trench is located at a bottom of the gate trench, the shielded gate trench is provided with a third gate, the third gate is isolated from the n-type shift region, the first gate and the second gate through an insulating medium layer; the third gate, the first n-type source region, the second n-type source region, the second gate and the conductive layer are electrically connected and are all connected to an emitter voltage.

In one embodiment, the third gate extends upwards in the gate trench.

In one embodiment, the trench-type power transistor further includes a p-type columnar epitaxial doped region located below the p-type body region, a dopant in of the p-type columnar epitaxial doped region and a dopant of the n-type doping region adjacent to the p-type columnar epitaxial doped region achieve a charge balance to form a super junction structure.

When the trench-type power transistor provided by the present disclosure is turned off, when the source voltage is greater than the drain voltage, the body region contact diode is in a reverse-bias state. Therefore, an inverse current flowing through a body diode may be greatly reduced, thereby greatly reducing minority carriers in the body diode and thus reducing reverse recovery charges and reverse recovery time, so that the power transistor can implement rapid reverse recovery function. At the same time, when the source-drain voltage reaches the turn-on voltage of the second current channel, the second current channel controlled by the second gate is turned on. In this case, the inverse current flows through the second current channel controlled by the second gate from the source to the drain.

BRIEF DESCRIPTION OF DRAWINGS

To illustrate embodiments of the present disclosure, the accompanying drawings used in the description of the embodiments will be described below.

DETAILED DESCRIPTION

The present disclosure is described hereinafter through specific embodiments in conjunction with the drawings.

The terms used in the present disclosure such as "have", "comprise" and "include" do not exclude the presence or addition of one or more other components or other combinations. Meanwhile, to illustrate the embodiments of the present disclosure, diagrams in the drawings exaggerate the thickness of the layers and regions of the present disclosure, and the size of the listed diagrams does not represent the actual size. The drawings described herein are illustrative. The listed embodiments in the Description are not intend to limit specific shapes of the regions shown in the drawings, but include obtained shapes, for example, deviations due to manufacturing.

A power transistor includes a cell region and a terminal region. The cell region is used for obtaining a low on-resistance, and the terminal region is used for increasing a withstand voltage of cells on the edge of the cell region. The terminal region is a universal structure for the power transistors, and has different design structures based on different product requirements. Thus, the structure of the terminal region in the trench-type power transistor will not be shown and illustrated in this embodiment. The trench-type power transistor described in this embodiment refers to the structure of the cell region in the power transistor.

Figure 3:
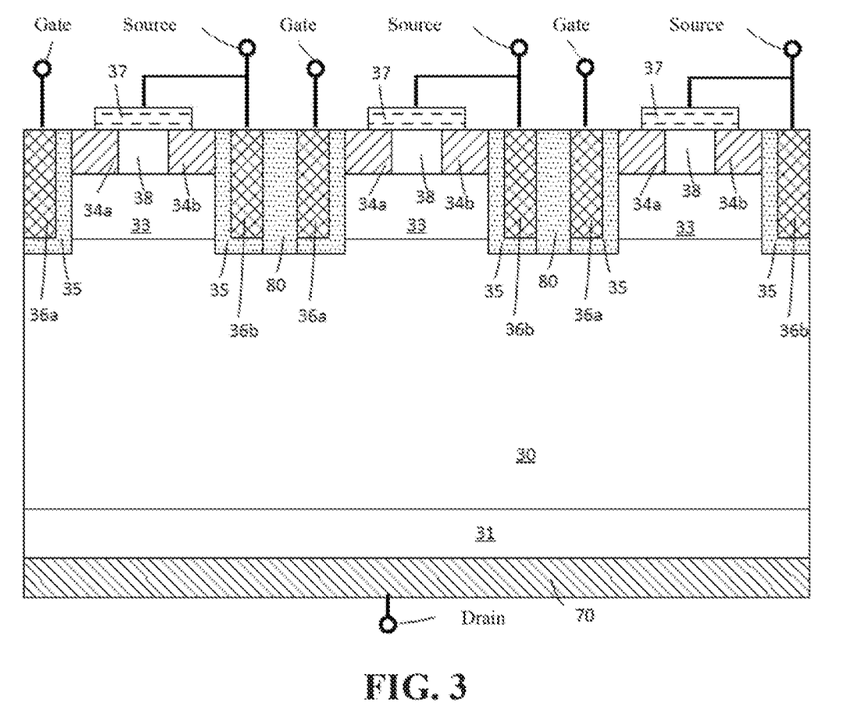
FIG. 3 is a cross-section view of a structure of a trench-type power transistor according to an embodiment.

FIG. 3 is a cross-section view of a structure of a trench-type power transistor according to an embodiment. As shown in FIG. 3, the trench-type power transistor provided by this embodiment includes a n-type drain region 31 and a n-type shift region 30 located on the n-type drain region 31. The n-type drain region 31 is connected to a drain voltage through a drain metal contact layer 70. At least two p-type body regions 33 are formed in the n-type shift region 30. Each p-type body region 33 is provided with a p-type body region contact region 38, a first n-type source region 34a and a second n-type source region 34b. Usually, the p-type body region contact region 38 is located between the first n-type source region 34a and the second n-type source region 34b.

In this embodiment, a structure including only three p-type body regions 33 is exemplarily shown.

The trench-type power transistor provided by this embodiment further includes a conductive layer 37 located on the p-type body region contact region 38. The conductive layer 37 and the p-type body region contact region 38 form a body region contact diode structure. The conductive layer 37 is a cathode of the body region contact diode structure and the p-type body region contact region 38 is an anode of the body region contact diode structure. In one embodiment, the conductive layer 37 may be a n-type polysilicon layer or a metal layer, and the body region contact diode may be a silicon-based body region contact diode or a Schottky barrier diode.

A parasitic body diode in the trench-type power transistor is formed between the p-type body region 33 and the n-type shift region 30. The p-type body region 33 is an anode of the body diode and the n-type shift region 30 is a cathode of the body diode. Therefore, the anode of the body region contact diode is connected to the anode of the body diode.

The trench-type power transistor provided by this embodiment further includes a gate trench located between two adjacent p-type body regions 33 and recessed in the n-type drift region 30. The bottom of the gate trench may be higher than the bottom of the p-type body region 33, or may be lower than the bottom of the p-type body region 33 or be at a same depth position with the bottom of the p-type body region 33. FIG. 3 only illustrates that the bottom of the gate trench is lower than the bottom of the p-type body region 33. The gate trench is provided with a gate dielectric layer 35, a first gate 36a and a second gate 36b. The first gate 36a and the second gate 36b are disposed on opposite sides inside the gate trench. The first gate 36a is externally connected to a gate voltage. The second gate 36b, the first n-type source region 34a, the second n-type source region 34b, and the conductive layer 37 are electrically connected and are all connected to a source voltage. In this embodiment, the conductive layer 37, the first n-type source region 34a and the second n-type source region 34b are in direct touch connection. Therefore the conductive layer 37 needs to be electrically connected to the second gate 36b. The first gate 36a and the second gate 36b are isolated by an insulating medium layer 80 in the gate trench. The insulating medium layer 80 usually is silicon oxide.

The trench-type power transistor provided by this embodiment further includes a first current channel located in the p-type body region 33 and between the first n-type source region 34a and the n-type drift region 30. The first gate 36a controls turn-on and turn-off of the first current channel through a gate voltage.

The trench-type power transistor provided by this embodiment further includes a second current channel located in the p-type body region 33 and between the second n-type source region 34b and the n-type drift region 30. The second gate 36b controls turn-on and turn-off of the second current channel through the source voltage. In one embodiment, a turn-on voltage of the first current channel controlled by the first gate 36a is greater than a turn-on voltage of the second current channel controlled by the second gate 36b.

The current channel includes an accumulation layer and an inversion layer which are formed in the surface of a semiconductor when applying voltage to the gate in the power transistor. In the drawings of this embodiment, the first current channel and the second current channel of the trench-type power transistor are both not shown.

Figure 4:
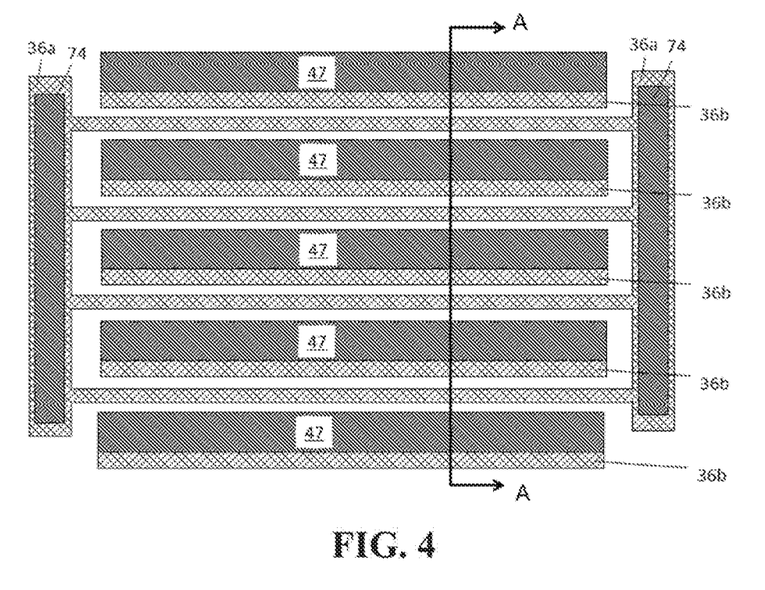
FIG. 4 is a top view of a structure of a trench-type power transistor according to an embodiment.
Figure 5:
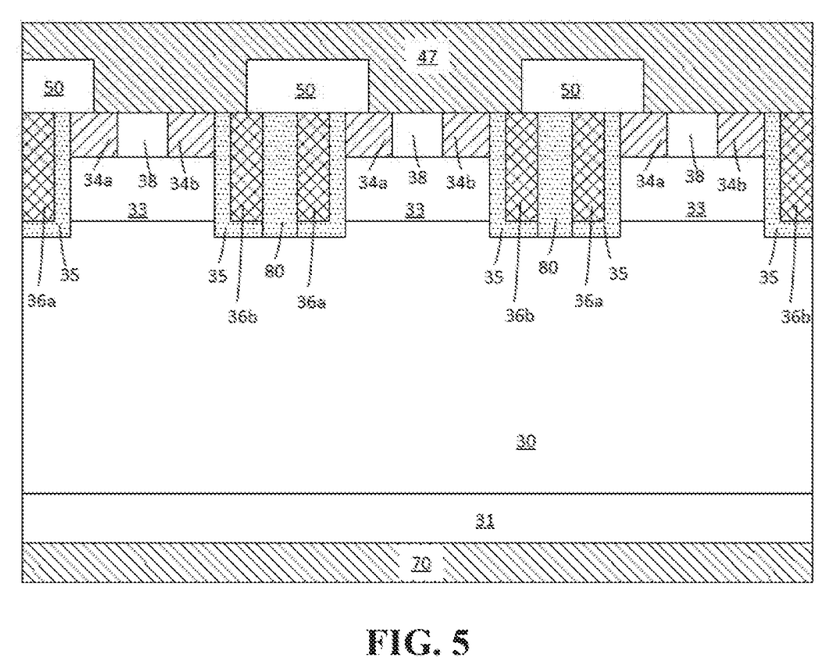
FIG. 5 is a cross-section view taken along a line A-A of a structure of the trench-type power transistor shown in FIG. 4.

FIG. 4 is a top view of a structure of a trench-type power transistor according to an embodiment. FIG. 4 is not a real top view but shows a position relationship of partial structure viewed from the top in the trench-type power transistor provided by this embodiment. FIG. 4 exemplarily shows a position of a source metal contact layer in a source metal contact hole. FIG. 5 is a cross-section view taken along a line A-A of a structure of a trench-type power transistor shown in FIG. 4. FIG. 5 only exemplarily shows a structure including three p-type body regions 33. FIGS. 4 and 5 correspond to an embodiment of a trench-type power transistor in which a body region contact diode structure adopts a Schottky barrier diode structure provided by the present disclosure and on the basis of the trench-type power transistor shown in FIG. 3. As shown in FIGS. 4 and 5, a source metal contact layer 47 is directly formed on the p-type body region 33. The source metal contact layer 47 is a conductive layer located on the p-type body region contact region 38. In this case, a doping concentration of the p-type body region contact region 38 is less than a maximum value of a doping concentration of the p-type body region 33, so the p-type body region contact region 38 and the source metal contact layer 47 form a Schottky barrier diode structure. The source metal contact layer 47 is a cathode of the Schottky barrier diode and the p-type body region contact region 38 is an anode of the Schottky barrier diode. The source metal contact layer 47 is directly connected to the second gate 36b, the first n-type source region 34a and the second n-type drift region 34b. The source metal contact layer 47 is externally connected to a source voltage, so the second gate 36b controls turn-on and turn-off of the second current channel adjacent to a side of the second n-type source region 34b through the source voltage. The first gate 36a is connected to a gate voltage through a gate metal contact layer 74, so the first gate 36a controls turn-on and turn-off of the first current channel adjacent to a side of the first n-type source region 34a though the gate voltage. The source metal contact layer 47 and the gate metal contact layer 74 are isolated from each other through an interlayer insulating layer 50. The interlayer insulating layer 50 usually is materials such as silica glass, boro-phospho-silicate glass or phosphosilicate glass.

In the trench-type power transistor shown in FIGS. 4 and 5, when the contact barrier of the Schottky barrier diode is extremely low, the Schottky barrier diode structure may be equivalent to an ohmic contact structure, which is able to reduce an inverse current flowing through a body diode to some extent, thereby reducing minority carriers in the body diode, and reducing reverse recovery charges and reverse recovery time, so that the power transistor is able to implement rapid reverse recovery function. The reverse recovery time of the power transistor at this time is longer than that of the Schottky barrier diode adopting a high contact barrier, but is shorter than that of a traditional power transistor without a body region contact diode structure.

Figure 6:
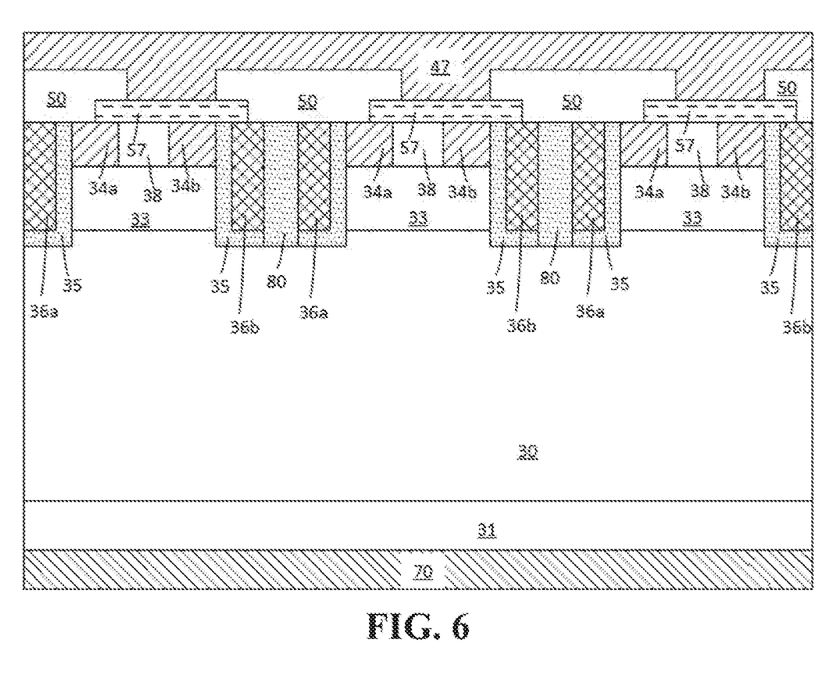
FIG. 6 is a cross-section view of a structure of another trench-type power transistor according to an embodiment.

FIG. 6 is a cross-section view of a structure of another trench-type power transistor according to an embodiment. FIG. 6 corresponds to an embodiment of a trench-type power transistor in which a body region contact diode structure adopts a silicon-based body region contact diode structure provided by the present disclosure and on the basis of the trench-type power transistor shown in FIG. 3. As shown in FIG. 6, a n-type polysilicon layer 57 is formed on the p-type body region 33. The n-type polysilicon layer 57 is a conductive layer located on a p-type body region contact region 38, so the p-type body region contact region 38 and the n-type polysilicon layer 57 form a silicon-based body region contact diode structure. The n-type polysilicon layer 57 is a cathode of the body region contact diode and the p-type body region contact region 38 is an anode of the body region contact diode. The n-type polysilicon layer 57 may be directly connected to a second gate 36b, a first n-type source region 34a, a second n-type source region 34b; then the n-type polysilicon layer 57 is externally connected to a source voltage through a source metal contact layer 47, as shown in FIG. 6. The n-type polysilicon layer 57 may also be directly connected to the first n-type source region 34a and the second n-type source region 34b. The second gate 36b is connected to the n-type polysilicon layer 57 through the source metal contact layer, and the source metal contact layer is externally connected to the source voltage. In this embodiment, the n-type polysilicon layer 57 is in direct touch connection with the second gate 36b, the first n-type source region 34a and the second n-type source region 34b. Then the n-type polysilicon layer 57 is externally connected to the source voltage through the source metal contact layer 47, so the second gate 36b controls turn-on and turn-off of the second current channel adjacent to a side of the second source region 34b through the source voltage. The first gate 36a is externally connected to a gate voltage through a gate metal contact layer (based on a position relationship in the cross-section, the gate metal contact layer is not shown in FIG. 6), so the first gate 36a controls turn-on and turn-off of the first current channel adjacent to a side of the first source region 34a though the gate voltage. The source metal contact layer 47 is isolated from the gate metal contact layer through an interlayer insulating layer 50. The interlayer insulating layer 50 usually is materials such as silica glass, boro-phospho-silicate glass or phosphosilicate glass.

Figure 7:
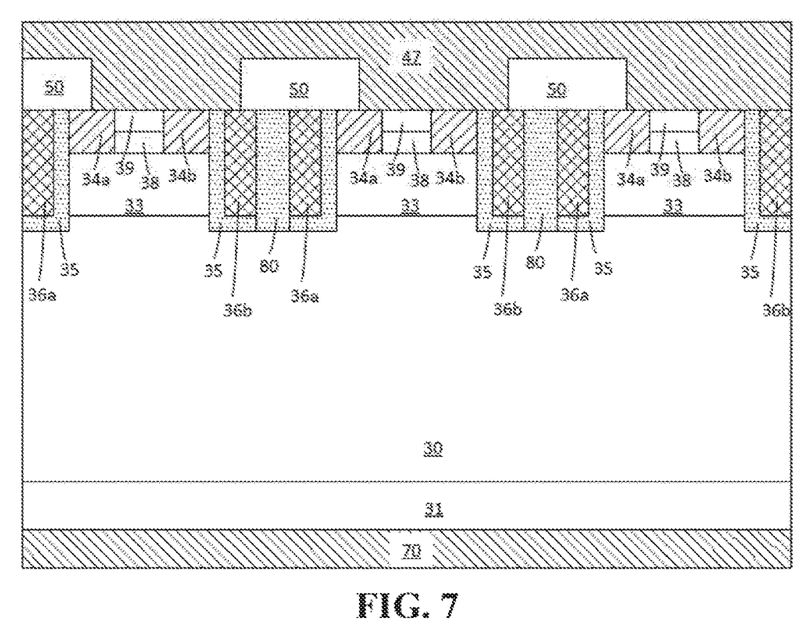
FIG. 7 is a cross-section view of a structure of another trench-type power transistor according to an embodiment.

FIG. 7 is a cross-section view of a structure of another trench-type power transistor according to an embodiment. As shown in FIG. 7, the trench-type power transistor of this embodiment includes a n-type drain region 31 and a n-type shift region 30 located on the n-type drain region 31. The n-type drain region 31 is connected to a drain voltage through a drain metal contact layer 70. At least two p-type body regions 33 are formed in the n-type shift region 30. A p-type body region contact region 38, a n-type doped region 39, a first n-type source region 34a and a second n-type source region 34b are located in each p-type body region 33. The p-type body region contact region 38 and the n-type doped region 39 are disposed between the first n-type source region 34a and the second n-type source region 34b. The n-type doped region 39 is located on the p-type body region contact region 38. The n-type doped region 39 is a conductive layer located on the p-type body region contact region 38. So the p-type body region contact region 38 and the n-type doped region 39 form a silicon-based body region contact diode structure. The n-type doped region 39 is a cathode of the body region contact diode structure and the p-type body region contact region 38 is an anode of the body region contact diode structure.

The trench-type power transistor provided by this embodiment further includes a gate trench located between two adjacent p-type body regions 33 and recessed in the n-type drift region 30. The bottom of the gate trench may be higher than the bottom of the p-type body region 33, or may be lower than the bottom of the p-type body region 33 or be at a same depth position with the bottom of the p-type body region 33. FIG. 7 only illustrates that the bottom of the gate trench is lower than the bottom of the p-type body region 33. The gate trench is provided with a gate dielectric layer 35, a first gate 36a and a second gate 36b. The first gate 36a and the second gate 36b are disposed on opposite sides inside the gate trench. The first gate 36a and the second gate 36b are isolated from each other through an insulating medium layer 80 in the gate trench. The insulating medium layer 80 usually is silicon oxide.

The trench-type power transistor provided by this embodiment further includes a first current channel located in the p-type body region 33 and between the first n-type source region 34a and the n-type drift region 30. The first gate 36a is externally connected to a gate voltage through a gate metal contact layer (based on a position relationship in the cross-section, the gate metal contact layer is not shown in FIG. 7), so the first gate 36a controls turn-on and turn-off of the first current channel through the gate voltage.

The trench-type power transistor provided by this embodiment further includes a second current channel located in the p-type body region 33 and between the second n-type source region 34b and the n-type drift region 30. The second gate 36b, the first n-type source region 34a, the second n-type source region 34b and the n-type doped region 39 are all externally connected a source voltage through a source metal contact layer 47. So the second gate 36b controls turn-on and turn-off of the second current channel through the source voltage.

The source metal contact layer 47 is isolated from the gate metal contact layer through an interlayer insulating layer 50. The interlayer insulating layer 50 usually is materials such as silica glass, boro-phospho-silicate glass or phosphosilicate glass.

Figure 8:
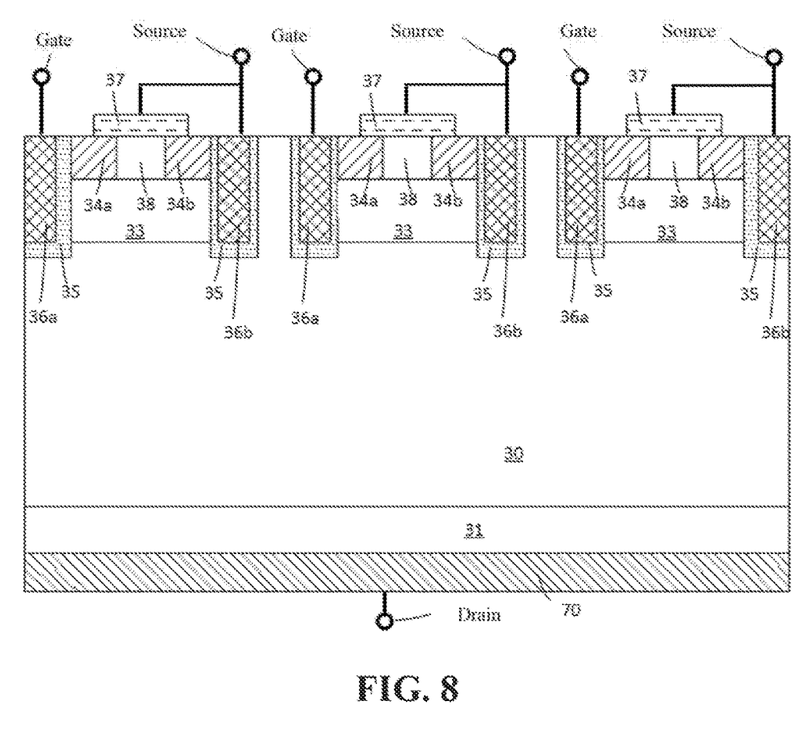
FIG. 8 is a cross-section view of a structure of another trench-type power transistor according to an embodiment.

In the trench-type power transistor provided by this embodiment, the first gate 36a and the second gate 36b may be formed in one gate trench (as shown in FIGS. 3, 5, 6 and 7), or in two different gate trenchs. FIG. 8 is a cross-section view of a structure of another trench-type power transistor according to an embodiment. FIG. 8 corresponds to an embodiment of a trench-type power transistor in which the first gate 36a and the second gate 36b are formed in different gate trenchs provided by the present disclosure and on the basis of the trench-type power transistor shown in FIG. 3. As shown in FIG. 8, the gate trench of the trench-type power transistor in this embodiment may include a first gate trench and a second gate trench. The first gate trench is provided with a gate dielectric layer 35 and a first gate 36a. The second gate trench is provided with a gate dielectric layer 35 and a second gate 36b. The first gate trench and the second gate trench are isolated by the n-type shift region 30. The first gate 36a controls turn-on and turn-off of the first current channel adjacent to a side of the first n-type source region 34a in the p-type body region 33 through a gate voltage. The second gate 36b controls turn-on and turn-off of the second current channel adjacent to a side of the second n-type source region 34b in the p-type body region 33 through a source voltage.

Figure 9:
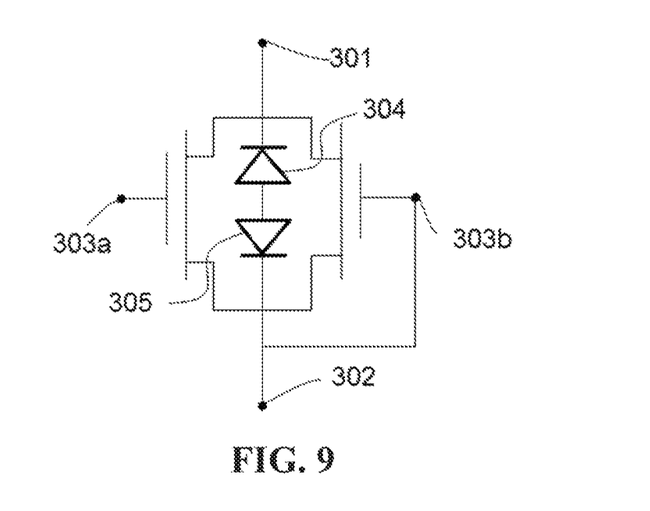
FIG. 9 is schematic diagram of an equivalent circuit of a trench-type power transistor according to an embodiment.

FIG. 9 is a schematic diagram of an equivalent circuit of a trench-type power transistor according to an embodiment. As shown in FIG. 9, the trench-type power transistor provided by this embodiment includes a drain 301, a source 302, a first gate 303a, a second gate 303b, a body diode 304 and a body region contact diode 305. The second gate 303b is connected to the source 302. The body region contact diode 305 may be a silicon-based diode or a Schottky barrier diode, and a cathode of the body diode 304 is connected to the drain 301. An anode of the body region contact diode 305 is connected to an anode of the body diode 304, and a cathode of the body region contact diode 305 is connected to the source 302. The first gate 303a is a control gate. The first gate 303a controls turn-on and turn-off of the first current channel controlled by the first gate 303a through the gate voltage. The second gate 303b is connected to the source 302, so that the second gate 303b controls turn-on and turn-off of the second current channel controlled by the second gate through the source voltage.

The working principle of the trench-type power transistor provided by this embodiment is illustrated hereafter. (1) when a gate-source voltage Vgs is less than a threshold voltage Vth of the trench-type power transistor (i.e., a turn-on voltage of the first current channel), and the gate-source voltage Vgs is greater than 0V, the trench-type power transistor is in a turn-off state. (2) When the gate-source voltage Vgs reaches the threshold voltage Vth of the trench-type power transistor, and the gate-source voltage Vgs is greater than 0V, the trench-type power transistor is turned on forward; in this case, a current flows from the drain to the source through the first current channel, and the second current channel is in the turn-off state and no current flows through. In a case where the trench-type power transistor of this embodiment is turned of, when the gate-source voltage Vgs is greater than 0V, the body region contact diode 305 is in a reverse-bias state, which is able to greatly reducing an inverse current flowing through a body diode, thereby greatly reducing minority carriers in the body diode and reducing reverse recovery charges and reverse recovery time, so that the power transistor is able to implement rapid reverse recovery function. At the same time, when the source-drain voltage Vsd reaches the turn-on voltage of the second current channel, the second current channel controlled by the second gate 303b controls is in a turn-on state. Therefore, the inverse current flows through the second current channel from the source 302 to the drain 301.

Figure 10:
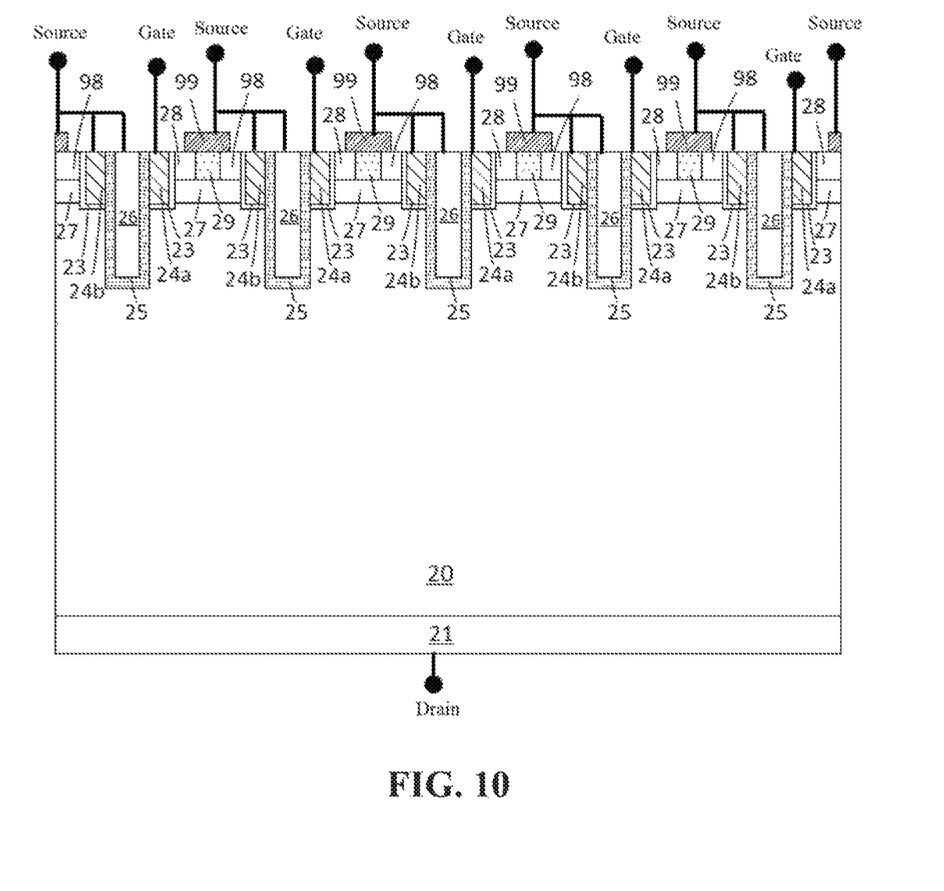
FIG. 10 is a cross-section view of a structure of another trench-type power transistor according to an embodiment.

FIG. 10 is a cross-section view of a structure of another trench-type power transistor according to an embodiment. As shown in FIG. 10, the trench-type power transistor of this embodiment includes a n-type drain region 21 and a n-type drift region 20 located on the n-type drain region 21. The n-type drain region 21 is externally connected to a drain voltage through a drain metal contact layer (not shown in FIG. 10).

The trench-type power transistor provided by this embodiment includes at least two p-type body regions 27 located in the n-type drift region 20 (six p-type body regions 27 are only exemplarily shown in FIG. 10). Each p-type body region 27 is provided with a p-type body region contact region 29, a first n-type source region 28 and a second n-type source region 98. Usually the p-type body region contact region 29 is disposed between the first n-type source region 28 and the second n-type source region 98.

A parasitic body diode in the trench-type power transistor is formed between the p-type body region 27 and the n-type shift region 20. The p-type body region 27 is an anode of the body diode and the n-type shift region 20 is a cathode of the body diode.

The trench-type power transistor provided by this embodiment includes a gate trench located between two adjacent p-type body regions 27 and recessed in the n-type drift region 20. The gate trench is provided with a gate dielectric layer 23, a first gate 24a and a second gate 24b. In one embodiment, the first gate 24a and the second gate 24b are separately disposed on opposite sides inside the gate trench.

The trench-type power transistor provided by this embodiment includes a shielded gate trench recessed in the n-type shift region 20. An opening of the shielded gate trench is located at a bottom of the gate trench. An opening width of the shielded gate trench may be the same with an opening width of the gate trench, or may be greater than or less than the opening width of the gate trench. FIG. 10 only shows an example in which the opening width of the shielded gate trench is less than the opening width of the gate trench.

A depth of the p-type body regions 27 may be the same with a depth of the gate trench in the n-type shift region 20, or may be greater than or less than the depth of the gate trench. FIG. 10 only shows an example in which the depth of the p-type body regions 27 is less than the depth of the gate trench.

The trench-type power transistor provided by this embodiment further includes a conductive layer 99 located on the p-type body region contact region 29. The conductive layer 99 and the p-type body region contact region 29 form a body region contact diode structure. The conductive layer 99 is a cathode of the body region contact diode structure and the p-type body region contact region 29 is an anode of the body region contact diode structure. So the anode of the body region contact diode is connected to the anode of the body diode.

The trench-type power transistor provided by this embodiment further includes a first current channel located in the p-type body region 27 and between the first n-type source region 28 and the n-type drift region 20. The first gate 24a is externally connected to a gate voltage. The first gate 24a controls turn-on and turn-off of the first current channel between the first n-type source region 28 and the n-type drift region 20 through the gate voltage.

The trench-type power transistor provided by this embodiment further includes: a second current channel located in the p-type body region 27 and between the second n-type source region 98 and the n-type drift region 20; a field oxide layer 25 and a third gate 26 located in the shielded gate trench. In one embodiment, the third gate 26 in the shielded gate trench extends upward to the interior of the gate trench. The third gate 26 is isolated from the n-type drift region 20, the first gate 24a and the second gate 24b through an insulating medium layer. In FIG. 10, the third gate 26 is directly isolated from the n-type drift region 20, the first gate 24a and the second gate 24b through the field oxide layer 25.

The first n-type source region 28, the second n-type source region 98, the second gate 24b, the third gate 26 and the conductive layer are electrically connected and are all connected to a source voltage, so the second gate 24b controls turn-on and turn-off of the second current channel between the second n-type source region 98 and the n-type drift region 20 through the source voltage. The third gate 26 is a shield gate. The third gate 26 forms a transverse electric field in the n-type drift region 20 through the source voltage, and plays a role of reducing on-resistance and increasing a withstand voltage.

In one embodiment, a turn-on voltage of the first current channel controlled by the first gate 24a is greater than a turn-on voltage of the second current channel controlled by the second gate 24b. At the same time, in FIG. 10, the conductive layer 99 is in direct touch connection with the first n-type source region 28 and the second n-type source region 98. Therefore the conductive layer 99 needs to be electrically connected to the second gate 24b and the third gate 26.

In the formation of the trench-type power transistor of this embodiment, a p-type columnar epitaxial doped region may be formed below the p-type body region, the dopant in the p-type columnar epitaxial doped region and the dopant in the n-type doping region achieve a charge balance to form a super junction structure. In this case, the trench-type power transistor of this embodiment is a power transistor adopting the super junction structure, the power transistor of the super junction structure is a universal structure.

What is claimed is:

1. A trench-type power transistor, comprising
   a n-type drain region and a n-type drift region located on the n-type drain region, wherein the n-type drift region is provided with at least two p-type body regions, each p-type body region is provided with a p-type body region contact region, a first n-type source region and a second n-type source region;
   a conductive layer located on the p-type body region contact region, wherein the conductive layer and the p-type body region contact region form a body region contact diode structure, wherein the conductive layer is a cathode of the body region contact diode structure and the p-type body region contact region is a anode of the body region contact diode structure;
   a gate trench located between two adjacent p-type body regions and recessed in the n-type drift region, wherein the gate trench is provided with a gate dielectric layer, a first gate and a second gate;
   a first current channel located in the p-type body region and between the first n-type source region and the n-type drift region, wherein the first gate controls turn-on and turn-off of the first current channel through a gate voltage; and
   a second current channel located in the p-type body region and between the second n-type source region and the n-type drift region, wherein the second gate, the first n-type source region, the second n-type source region and the conductive layer are electrically connected and are all connected to a source voltage, the second gate controls turn-on and turn-off of the second current channel through the source voltage.

2. The trench-type power transistor of claim 1, wherein a turn-on voltage of the first current channel is greater than a turn-on voltage of the second current channel.

3. The trench-type power transistor of claim 1, wherein the conductive layer is a source metal contact layer located on each of the p-type body regions, a doping concentration of the p-type body region contact region is less than a maximum value of a doping concentration of the p-type body region, and the p-type body region contact region and the source metal contact layer form a Schottky barrier diode structure.

4. The trench-type power transistor of claim 3, wherein the second gate, the first n-type source region and the second n-type source region are connected through the source metal contact layer, the source metal contact layer is externally connected to the source voltage.

5. The trench-type power transistor of claim 1, wherein the conductive layer is a n-type doped region located in the p-type body region, the n-type doped region and the p-type body region form a silicon-based body region contact diode structure.

6. The trench-type power transistor of claim 5, wherein the second gate is connected to the first n-type source region, the second n-type source region and the n-type doped region through the source metal contact layer, the source metal contact layer is externally connected to the source voltage.

7. The trench-type power transistor of claim 1, wherein the first gate and the second gate are disposed on opposite sides inside the gate trench, the first gate and the second gate are isolated by an insulating medium layer in the gate trench.

8. The trench-type power transistor of claim 1, further comprising:
   a shielded gate trench recessed in the n-type shill region, wherein an opening of the shielded gate trench is located at a bottom of the gate trench, the shielded gate trench is provided with a third gate, the third gate is isolated from the n-type shift region, the first gate and the second gate through an insulating medium layer; the third gate, the first n-type source region, the second n-type source region, the second gate and the conductive layer are electrically connected and are all connected to an emitter voltage.

9. The trench-type power transistor claim 8, wherein the third gate extends upwards in the gate trench.

10. The trench-type power transistor of claim 1, further comprising:
    a p-type columnar epitaxial doped region located below the p-type body region, a dopant in of the p-type columnar epitaxial doped region and a dopant of the n-type doping region adjacent to the p-type columnar epitaxial doped region achieve a charge balance to form a super junction structure.

* * * * *